United States Patent
Sundström et al.

(10) Patent No.: US 9,020,077 B2
(45) Date of Patent: Apr. 28, 2015

(54) CORRECTION OF IMBALANCES IN A COMPLEX INTERMEDIATE FREQUENCY MIXER

(75) Inventors: Lars Sundström, Södra Sandby (SE); Fenghao Mu, Hjärup (SE); Leif Wilhelmsson, Dalby (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 13/823,774

(22) PCT Filed: Sep. 16, 2011

(86) PCT No.: PCT/EP2011/066101
§ 371 (c)(1),
(2), (4) Date: Mar. 15, 2013

(87) PCT Pub. No.: WO2012/038338
PCT Pub. Date: Mar. 29, 2012

(65) Prior Publication Data
US 2013/0177113 A1    Jul. 11, 2013

Related U.S. Application Data

(60) Provisional application No. 61/389,331, filed on Oct. 4, 2010.

(30) Foreign Application Priority Data

Sep. 24, 2010  (EP) .................................... 10010555

(51) Int. Cl.
*H04L 27/22*  (2006.01)
*H04B 1/16*  (2006.01)
(Continued)

(52) U.S. Cl.
CPC ............... *H04B 1/126* (2013.01); *H03D 7/166* (2013.01); *H03D 2200/0088* (2013.01)

(58) Field of Classification Search
CPC . H04L 27/22; H04L 27/2273; H04L 27/2332; H04L 2025/03407; H04L 2025/03414; H03D 3/004; H03D 3/007; H03D 3/009; H03D 3/242

USPC ............... 375/279–281, 283, 329–332, 344; 329/304, 306, 345, 346; 455/208, 209
See application file for complete search history.

(56) References Cited

U.S. PATENT DOCUMENTS 5,926,500 A * 7/1999 Odenwalder ................. 375/144
6,330,290 B1   12/2001 Glas
(Continued)

FOREIGN PATENT DOCUMENTS

EP    0305603 A1    3/1989
EP    1111803 A1    6/2001
(Continued)

OTHER PUBLICATIONS

Der, L. and Razavi, B., "A 2GHz CMOS Image-Reject Receiver with LMS Calibration", IEEE Journal of Solid-State Circuits, vol. 32, No. 2, Feb. 2003, pp. 167-175.

*Primary Examiner* — Young T. Tse
(74) *Attorney, Agent, or Firm* — Coats and Bennett, PLLC

(57) ABSTRACT

A complex intermediate frequency mixer (IFM) for frequency translating a received complex intermediate frequency, IF, signal, wherein the received complex IF signal comprises at least two frequency bands located at upper-side and lower-side of 0 Hz, is provided. The complex intermediate frequency mixer comprises a first, second, third and fourth mixer (M1, M2, M3, M4). The complex intermediate frequency mixer further comprises a first, second, third and fourth gain adjusting component ($\alpha 1$, $\alpha 2$, $\delta 2$, $\delta 1$), connected to a first, second, third and fourth mixer output (M1-out, M2-out, M3-out, M4-out), respectively. Moreover, a first summing unit (S1), connected to a first gain output ($\alpha 1$-out), a fourth gain output ($\delta 1$-out) and a third mixer output (M3-out) negated, and second summing unit (S2), connected to the second gain output ($\alpha 2$-out), the third gain output ($\delta 2$-out) and the fourth mixer output (M4-out), are configured to output a first baseband complex signal of the received complex IF signal.

6 Claims, 12 Drawing Sheets

(51) Int. Cl.
   *H03D 7/16* (2006.01)
   *H04B 1/12* (2006.01)

(56) References Cited

U.S. PATENT DOCUMENTS

| | | | |
|---|---|---|---|
| 6,833,770 B1* | 12/2004 | Fukumoto et al. | 332/103 |
| 6,892,060 B2 | 5/2005 | Zheng | |
| 7,130,604 B1 | 10/2006 | Wong et al. | |
| 7,248,625 B2 | 7/2007 | Chien | |
| 7,301,686 B2 | 11/2007 | Tanaka et al. | |
| 2002/0160741 A1* | 10/2002 | Kim et al. | 455/318 |
| 2004/0137869 A1* | 7/2004 | Kim | 455/324 |
| 2006/0133548 A1 | 6/2006 | Oh et al. | |
| 2009/0291649 A1 | 11/2009 | Fortier et al. | |
| 2010/0067622 A1 | 3/2010 | Komaili et al. | |
| 2011/0043277 A1* | 2/2011 | Sakamoto et al. | 329/306 |
| 2011/0159833 A1* | 6/2011 | Kenington | 455/232.1 |

FOREIGN PATENT DOCUMENTS

| | | |
|---|---|---|
| WO | 9914863 A1 | 3/1999 |
| WO | 0139364 A1 | 5/2001 |
| WO | 2005091493 A1 | 9/2005 |
| WO | 2009057051 A2 | 5/2009 |
| WO | 2012038336 A1 | 3/2012 |

* cited by examiner

CORRECTION OF IMBALANCES IN A COMPLEX INTERMEDIATE FREQUENCY MIXER

TECHNICAL FIELD

The present invention relates to a complex intermediate frequency mixer for frequency translating received complex intermediate frequency signals and to a receiver comprising the complex intermediate frequency mixer.

BACKGROUND

A known complex intermediate frequency (IF) based receiver architecture is depicted in FIG. 1. The receiver in FIG. 1 is designed to process RF signals carried by two carriers simultaneously. The received radio frequency (RF) signals are first fed to a low-noise amplifier (LNA). The LNA is followed by quadrature RF down-converting mixers where the local oscillator (LO) frequency is set to the centre of the two carriers such that the two carriers will be placed on the same IF frequency. The complex output of the RF down-converting mixers represents both the carriers where the lower frequency carrier appears on the negative side and the higher frequency carrier appears on the positive side. IF filters (IFF) may be used to filter out these carriers while suppressing the interfering signals. A complex IF mixer is used to down-convert the two carriers to baseband after which channel select filtering (CSF) and analogue-to-digital conversion (ADC) is performed. The receiver, shown in FIG. 1, is simplified and is for the purpose of illustration only.

A further simplification can be made where only the frequency translation operations are considered. This is shown in FIG. 2 where the frequency translation for the lower side (LS) carrier is shown together with the phase relations for the LO signal components. The corresponding diagram for two carriers is shown in FIG. 3.

It is known that quadrature mixers suffer from gain and phase imbalance and that the performance in this respect is usually measured as image-rejection ratio (IRR). For a RF quadrature mixer the IRR is typically in the range of 30 to 40 dB. In the architecture described above, a finite image rejection will lead to that the lower side carrier effectively will leak into the upper side carrier and vice versa. Gain and phase imbalance will also be present in the IF filters and the complex mixers. The complex mixer will, however, have a much better IRR compared with the RF mixer as it operates with much lower frequencies.

Another scenario where even higher IRR might be required is when the first carrier has a first bandwidth and the second carrier has a second bandwidth, where the first bandwidth is narrower than the second bandwidth. The image frequency range for the second carrier will then be larger than the first carrier. This means that not only the first carrier may leak into the second carrier due to limited IRR but also other carriers present adjacent to the first carrier and within the image frequency range of the second carrier. The power of these signals may be much larger and therefore have a large impact on performance when interfering with the second carrier. This can only be mitigated by providing an improved IRR.

SUMMARY

An object of the present invention is to reduce both gain and phase imbalances introduced by an RF mixer in a receiver.

According to an aspect of the invention, the object is achieved by a complex intermediate frequency mixer for frequency translating a received complex intermediate frequency, IF, signal, wherein the received complex IF signal comprises at least two frequency bands located at upper-side and lower-side of 0 Hz. The complex intermediate frequency mixer comprises a first-phase path input for receiving a first-phase signal of the received complex IF signal, a second-phase path input for receiving a second-phase signal of the received complex IF signal. Moreover, the complex IF mixer comprises a first mixer configured to be driven by a first-phase local oscillator signal and connected to the first-phase path input, the first mixer having a first mixer output, a second mixer configured to be driven by a second-phase local oscillator signal and connected to the first-phase path input, the second mixer having a second mixer output, wherein the first-phase and second-phase local oscillator signals are in quadrature phase, a third mixer configured to be driven by the second-phase local oscillator signal and connected to the second-phase path input, the third mixer having a third mixer output, a fourth mixer configured to be driven by the first-phase local oscillator signal and connected to the second-phase path input, the fourth mixer having a fourth mixer output. The first mixer is configured to down-convert said first-phase signal of the received complex IF signal from said received frequency to a baseband frequency using the first-phase local oscillator signal to form a first signal to be output from the first mixer output. Furthermore, the second mixer is configured to down-convert said first-phase signal of the received complex IF signal from said received frequency to a baseband frequency using the second-phase local oscillator signal to form a second signal to be output from the second mixer output and the third mixer is configured to down-convert said second-phase signal of the received complex IF signal from said received frequency to a baseband frequency using the second-phase local oscillator signal to form a third signal to be output from the third mixer output. The fourth mixer is configured to down-convert said second-phase signal of the received complex IF signal from said received frequency to a baseband frequency using the first-phase local oscillator signal to form a fourth signal to be output from the fourth mixer output. The complex intermediate frequency mixer further comprises a first gain adjusting component, having a first gain input, a first gain output and a first gain control input for adjusting gain of the first gain adjusting component. The first gain input is connected to the first mixer output. The complex IF mixer further comprises a second gain adjusting component, having a second gain input, a second gain output and a second gain control input for adjusting gain of the second gain adjusting component. The second gain input is connected to the second mixer output. The complex IF mixer further comprises a third gain adjusting component, having a third gain input, a third gain output and a third gain control input for adjusting gain of the third gain adjusting component. The third gain input is connected to the third mixer output. The complex IF mixer further comprises a fourth gain adjusting component, having a fourth gain input, a fourth gain output and a fourth gain control input for adjusting gain of the fourth gain adjusting component. The fourth gain input is connected to the fourth mixer output. Moreover, the complex IF mixer comprises a first summing unit, having a first summing input and a first summing output. The first summing input is connected to the first gain output, the fourth gain output and the third mixer output negated. The complex IF mixer further comprises a second summing unit, having a second summing input and a second summing output. The second summing input is connected to the second gain output, the third gain output and the fourth mixer output. The first and second summing units are configured to output a first baseband complex signal of the received complex IF signal.

According to another aspect of the invention, the object is achieved by a receiver comprising a complex intermediate frequency mixer according to embodiments of the present invention, and a quadrature RF mixer for generating the complex intermediate frequency signal by down-conversion of a radio frequency signal.

Thanks to the fact that the first, second, third and fourth gain adjusting components are inserted into the signal paths at a location after signals has been down-converted to baseband frequency signals, it is possible to compensate for gain and phase imbalances introduced by the quadrature RF mixer by using only gain correction in the first-phase signal path and the second-phase signal path. In this manner, power consumption of the receiver may be reduced and the performance, in terms of reduced imbalances, may be increased. As a result, the above mentioned object is achieved. It may be noted that the first phase signal path may be the in-phase signal path and the second phase signal path may be the quadrature phase signal path of the complex IF mixer, or vice versa.

Advantageously, since the correction of gain and phase imbalances is performed where signal frequencies are in the base band, power consumption of the complex IF mixer may be reduced. In addition, the complex IF mixer may become more accurate, i.e. imbalances in the receiver and/or IF mixer are reduced.

In some embodiments of the complex intermediate frequency mixer according to the present invention, the complex intermediate frequency mixer may further comprise a third summing unit, having a third summing input and a third summing output. The third summing input is connected to the first gain output, the fourth gain output and the third mixer output. The complex IF mixer further comprises a fourth summing unit, having a fourth summing input and a fourth summing output. The fourth summing input is connected to the second gain output negated, the third gain output negated and the fourth mixer output. The third and fourth summing units are configured to output a second baseband complex signal of the received complex IF signal. Thereby, the complex IF mixer may process and output a second baseband complex signal of the received complex IF signal in addition to the first baseband complex signal. Consequently, the complex IF mixer may support dual carriers in the received complex IF signal.

In some embodiments of the complex intermediate frequency mixer according to the present invention, the complex intermediate frequency mixer may further comprise a fifth gain adjusting component, having a fifth gain input, a fifth gain output and a fifth gain control input. The fifth gain input is connected to the first mixer output. The complex IF mixer further comprises a sixth gain adjusting component, having a sixth gain input, a sixth gain output and a sixth gain control input. The sixth gain input is connected to the second mixer output. The complex IF mixer further comprises a seventh gain adjusting component, having a seventh gain input, a seventh gain output and a seventh gain control input. The seventh gain input is connected to the third mixer output. The complex IF mixer further comprises an eighth gain adjusting component, having an eighth gain input, an eighth gain output an eighth gain control input. The eighth gain input is connected to the fourth mixer output. The complex IF mixer further comprises a third summing unit, having a third summing input and a third summing output. The third summing input is connected to the first gain output, the sixth gain output and the seventh gain output. The complex IF mixer further comprises a fourth summing unit, having a fourth summing input and a fourth summing output. The fourth summing input is connected to the second gain output negated, the fifth gain output and the eighth gain output. The first summing input is connected to the third mixer output via the seventh gain adjusting component negated. The second summing input is connected to the fourth mixer output via the eighth gain adjusting component. The third and fourth summing units (S3, S4) are configured to output a second baseband complex signal of the received complex IF signal. Thanks to the addition of a fifth, sixth, seventh and eighth gain adjusting component, a symmetric architecture is obtained. An advantage with a symmetric architecture is that circuit implementation will exhibit lower signal path imbalance within itself compared to a non-symmetric architecture.

In some embodiments of the complex intermediate frequency mixer according to the present invention, the first summing input further is connected to the sixth gain output, the second summing input further is connected to the fifth gain output, the third summing input further is connected to the fourth gain output, and the fourth summing input further is connected to the third gain output negated.

In some embodiments of the complex intermediate frequency mixer according to the present invention, the first-phase is in-phase and second-phase is quadrature phase.

In some embodiments of the complex intermediate frequency mixer according to the present invention, the gain adjusting components are resistor/capacitor networks, voltage-to-current-converters or any signal converting network.

In some embodiments of the complex intermediate frequency mixer according to the present invention, the first and second gain adjusting components have been controlled to apply different gain to signals passing though the first and second gain adjusting components, respectively, and the third and fourth gain adjusting components have been controlled to apply different gain to signals passing though the third and fourth gain adjusting components, respectively. Since there is an imbalance introduced by irregularities in the gain adjusting components and the first, second, third and fourth mixers, it is advantageous to individually control the gain adjusting components, such as to correct for these imbalances as well.

Further features of, and advantages with, the present invention will become apparent when studying the appended claims and the following description. It is to be understood that different features of the present invention may be combined to create embodiments other than those described in the following, without departing from the scope of the present invention, as defined by the appended claims.

BRIEF DESCRIPTION OF THE DRAWINGS

The various aspects of the invention, including its particular features and advantages, will be readily understood from the following detailed description and the accompanying drawings, in which.

DETAILED DESCRIPTION

Figure 1:
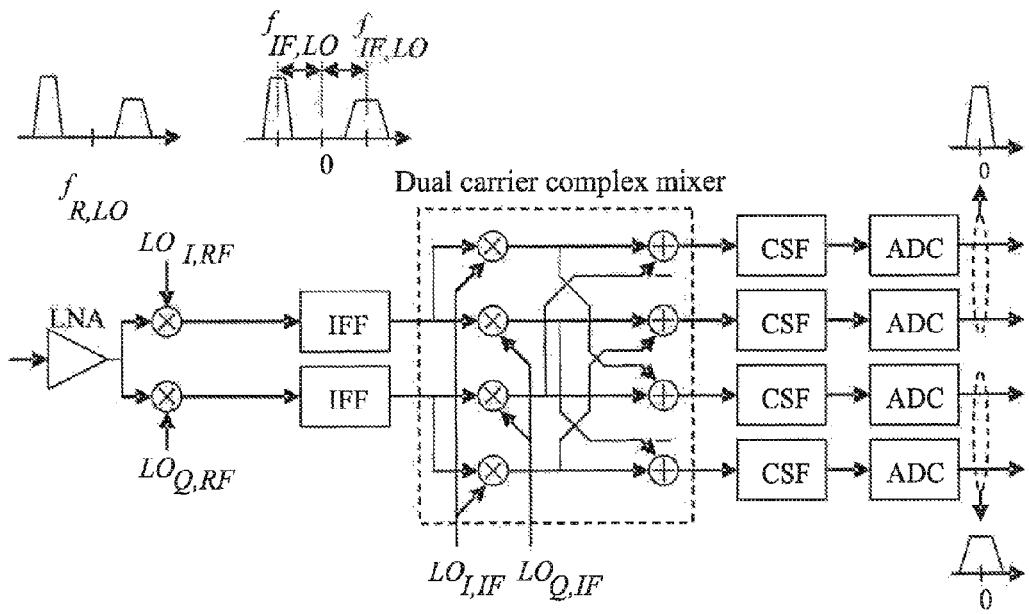
FIG. 1 shows a schematic block diagram of an exemplifying dual carrier complex IF based receiver.

Throughout the following description similar reference numerals have been used to denote similar elements, parts, items or features, when applicable. It may be noted that α1, α2, β1, β2, ϵ1, ϵ2, δ1 and δ2 have been used to denote elements $\alpha_1$, $\alpha_2$, $\beta^1$, $\beta_2$, $\epsilon_1$, $\epsilon_2$, $\delta_1$ and $\delta_2$ in the drawings. Furthermore, not all reference numeral have been inserted into all drawing in order to keep the drawings simple and easier to comprehend. See FIG. 13 for detailed explanations of all reference numerals. For example, first mixer M1 in FIG. 5 has a first mixer output M1-out which is not indicated in FIG. 5, but in FIG. 13, first summing unit S1 in FIG. 6 has first summing inputs S1-in, which are not indicated in FIG. 6, but in FIG. 13.

In the conception of the present invention, the observations described below in conjunction with FIGS. 4 and 5 have been made by the present inventors.

Figure 4:
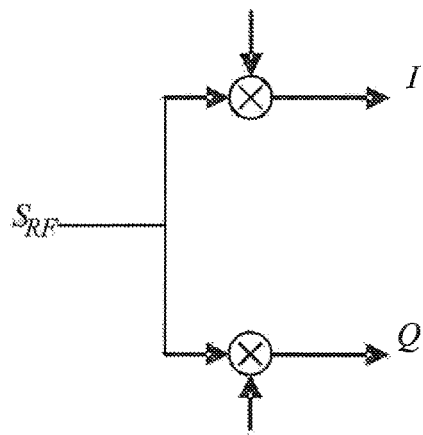
FIG. 4 shows a schematic block diagram of a model for representing imbalances in a quadrature down-converter.

FIG. 4. shows a model of an RF quadrature down-converter fed by LO (local oscillating) signals LO1, LO2 (only considering the fundamental frequency $\omega_{RF,LO}$). Ideally these signals have identical magnitude (A=1) and are in perfect quadrature (θ=0). When this is the case, the LO signals LO1, LO2 resembles a phasor $e^{-j\omega t}$. Any deviation from these values results in an imbalance. Many other models may be devised, but the advantage of this model is that it only considers the gain and phase imbalance in one path, not all gain and/or phase imbalances of the converter in two paths (the paths are explained below). This facilitates the implementation of a correction network that has reduced complexity as compared to a correction network that is intended to compensate for gain and/or phase imbalances of the converter in the two paths.

Notably, in this model all imbalances are defined to occur in the I-path, i.e. the Q-path is defined as the reference. Consequently, for a real quadrature down-converter with incorrect gain in the Q path, the incorrect gain is referred to as a common gain error for the complete quadrature down-converter. In other words, as long as only gain and phase imbalances are considered this model does not impose any restrictions.

Figure 2:
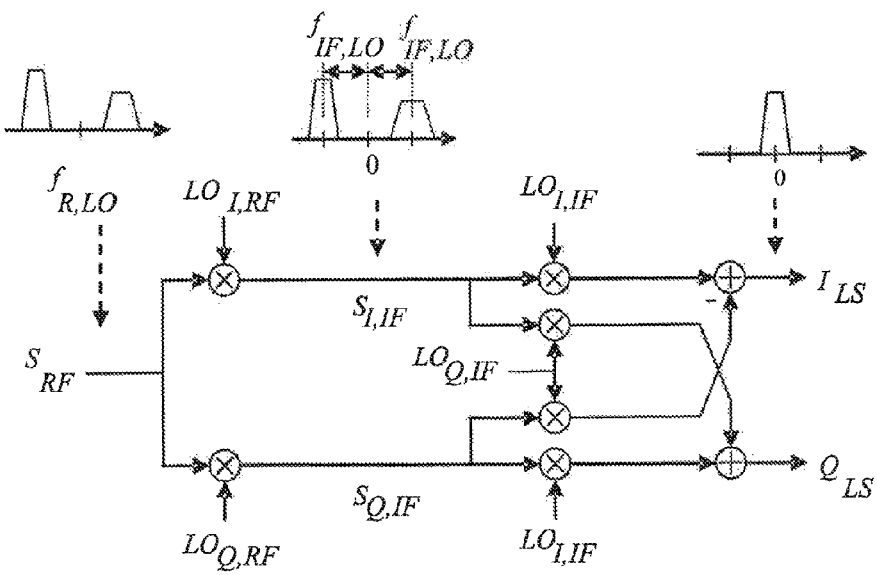
FIG. 2 shows a schematic block diagram of frequency translation operations for lower side carrier.
Figure 3:
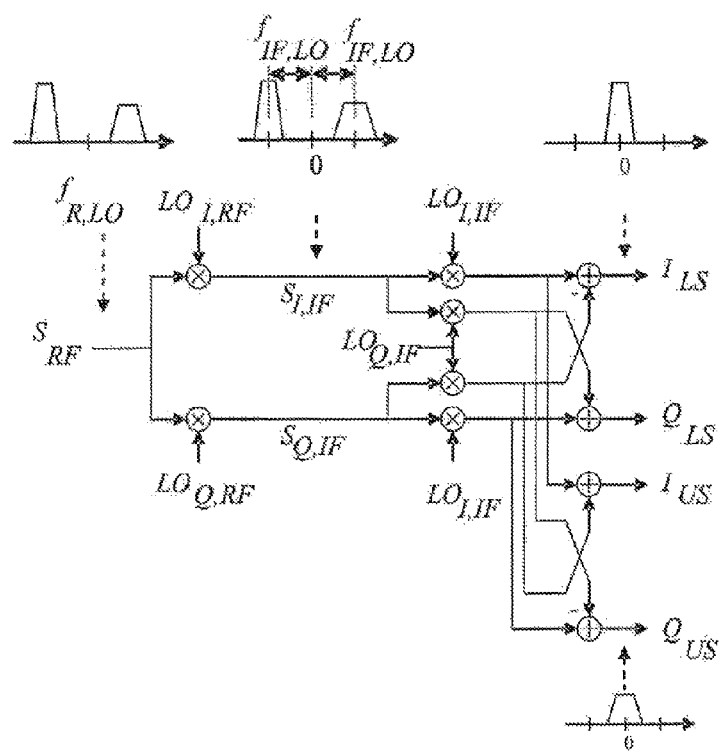
FIG. 3 shows a schematic block diagram of frequency translation operations for lower side carrier and upper side carrier.
Figure 5:
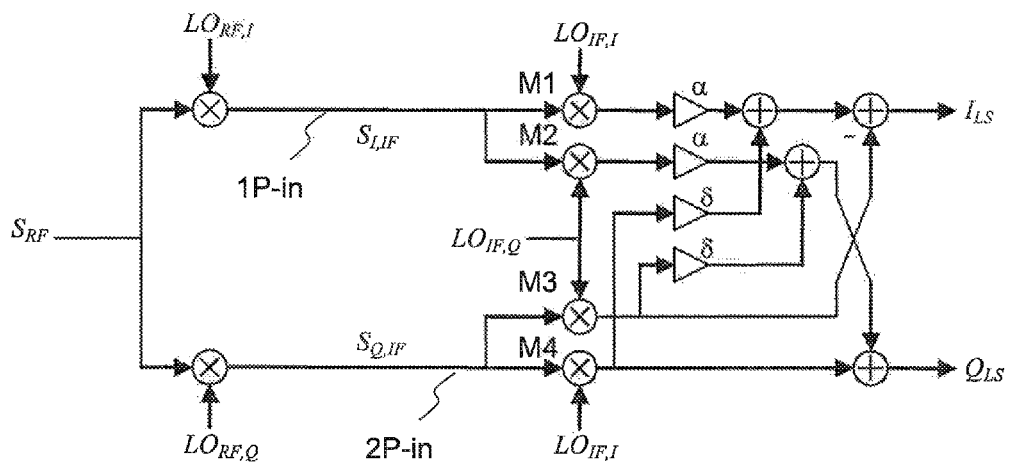
FIG. 5 shows a schematic block diagram of a complex IF mixer according to embodiments of the present invention.

Moreover, FIG. 5 shows an exemplifying complex IF based receiver according to the present invention. In FIG. 5, only a part for the lower-side (LS) carrier (originating from FIG. 2) of the complex IF based receiver is shown for reasons of simplicity only. In this exemplifying embodiment of the present invention, two different gain adjusting components α and δ are inserted after the first, second, third and fourth mixer M1, M2, M3, M4 of the complex IF mixer. There are in fact four gain adjusting components, but these are adjusted to the same gain (or fixed) in pairs, shown as α and δ. It may be shown that gain of gain adjusting component α should be equal to $$\frac{1}{A\cos(\theta)}$$

and gain of gain adjusting component δ should be equal to −tan(θ) in order to fully cancel imbalances (these relationships are referred to as statement A1). It is understood that I and Q paths may be interchanged.

Furthermore, the present inventors have realized that the architecture shown in FIG. 5 may be simplified as long as only the lower-side band or the upper-side band is to be considered. The addition of leak paths defined by δ can be combined with the two original summations (performed by the summing units), see FIG. 6. This solution is preferred rather than having to add signals in two steps as in FIG. 5 as it reduces the complexity of an implemented circuit. It may be noted that all summing units have two inputs, when adding the signals in two steps, while all summing units have three inputs, when adding the signals in one step.

Figure 6:
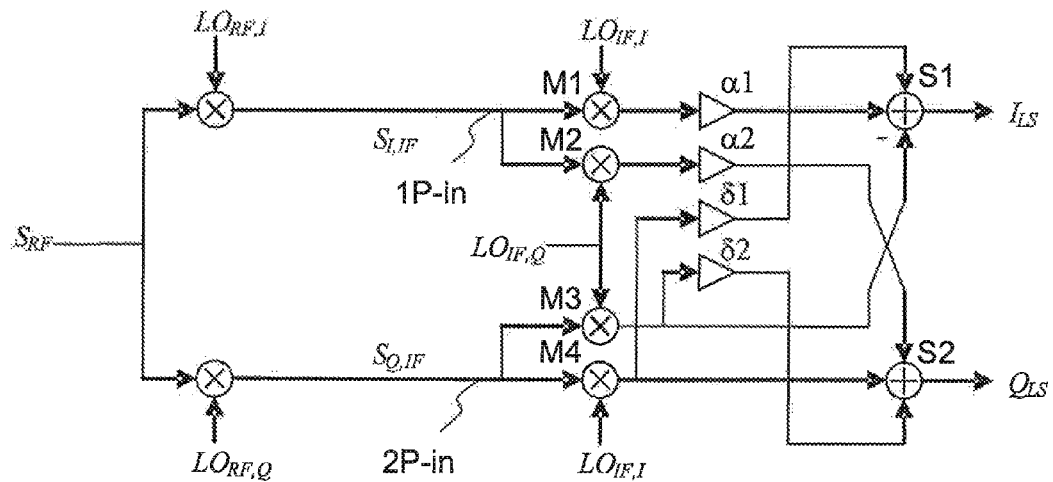
FIG. 6 shows a schematic block diagram of a complex IF mixer according to embodiments of the present invention.

With reference to FIG. 6, there is shown an exemplifying complex intermediate frequency mixer IFM for frequency translating a received complex intermediate frequency, IF, signal, wherein the received complex IF signal comprises at least two frequency bands located at upper-side and lower-side of 0 Hz. In order to keep the Figure less complex, it is referred to FIG. 13 for indication of some of the reference numerals used here. The complex intermediate frequency mixer comprises a first-phase path input 1P-in for receiving a first-phase signal of the received complex IF signal, a second-phase path input 2P-in for receiving a second-phase signal of the received complex IF signal. Moreover, the complex IF mixer comprises a first mixer M1 configured to be driven by a first-phase local oscillator signal and connected to the first-phase path input 1P-in, the first mixer M1 having a first mixer output M1-out, a second mixer M2 configured to be driven by a second-phase local oscillator signal and connected to the first-phase path input 1P-in, the second mixer M2 having a second mixer output M2-out, wherein the first-phase and second-phase local oscillator signals are in quadrature phase, a third mixer M3 configured to be driven by the second-phase local oscillator signal and connected to the second-phase path input 2P-in, the third mixer M3 having a third mixer output M3-out, a fourth mixer M4 configured to be driven by the first-phase local oscillator signal and connected to the second-phase path input 2P-in, the fourth mixer M4 having a fourth mixer output M4-out. The first mixer M1 is configured to down-convert said first-phase signal of the received complex IF signal from said received frequency to a baseband frequency using the first-phase local oscillator signal to form a first signal to be output from the first mixer output M1-out. Furthermore, the second mixer M2 is configured to down-convert said first-phase signal of the received complex IF signal from said received frequency to a baseband frequency using the second-phase local oscillator signal to form a second signal to be output from the second mixer output M2-out and the third mixer M3 is configured to down-convert said second-phase signal of the received complex IF signal from said received frequency to a baseband frequency using the second-phase local oscillator signal to form a third signal to be output from the third mixer output M3-out. The fourth mixer M4 is configured to down-convert said second-phase signal of the received complex IF signal from said received frequency to a baseband frequency using the first-phase local oscillator signal to form a fourth signal to be output from the fourth mixer output M4-out. The complex intermediate frequency mixer IFM further comprises a first gain adjusting component $\alpha 1$, having a first gain input $\alpha 1$-in, a first gain output $\alpha 1$-out and a first gain control input for adjusting gain of the first gain adjusting component $\alpha 1$. The first gain input $\alpha 1$-in is connected to the first mixer output M1-out. The complex IF mixer further comprises a second gain adjusting component $\alpha 2$, having a second gain input $\alpha 2$-in, a second gain output $\alpha 2$-out and a second gain control input for adjusting gain of the second gain adjusting component $\alpha 2$. The second gain input $\alpha 2$-in is connected to the second mixer output M2-out. The complex IF mixer further comprises a third gain adjusting component $\delta 2$, having a third gain input $\delta 2$-in, a third gain output $\delta 2$-out and a third gain control input for adjusting gain of the third gain adjusting component $\delta 2$. The third gain input $\delta 2$-in is connected to the third mixer output M3-out. The complex IF mixer further comprises a fourth gain adjusting component $\delta 1$, having a fourth gain input $\delta 1$-in, a fourth gain output $\delta 1$-out and a fourth gain control input for adjusting gain of the fourth gain adjusting component $\delta 1$. The fourth gain input $\delta 1$-in is connected to the fourth mixer output M4-out. Moreover, the complex IF mixer comprises a first summing unit S1, having a first summing input S1-in and a first summing output S1-out. The first summing input S1-in is connected to the first gain output $\alpha 1$-out, the fourth gain output $\delta 1$-out and the third mixer output M3-out negated. The complex IF mixer further comprises a second summing unit S2, having a second summing input S2-in and a second summing output S2-out. The second summing input S2-in is connected to the second gain output $\alpha 2$-out, the third gain output $\delta 2$-out and the fourth mixer output M4-out. The first and second summing units S1, S2 are configured to output a first baseband complex signal of the received complex IF signal.

So far only lower-side carrier support has been discussed in order to keep drawings and discussion less complex. In the following, dual-carrier support is to be discussed.

Figure 8:
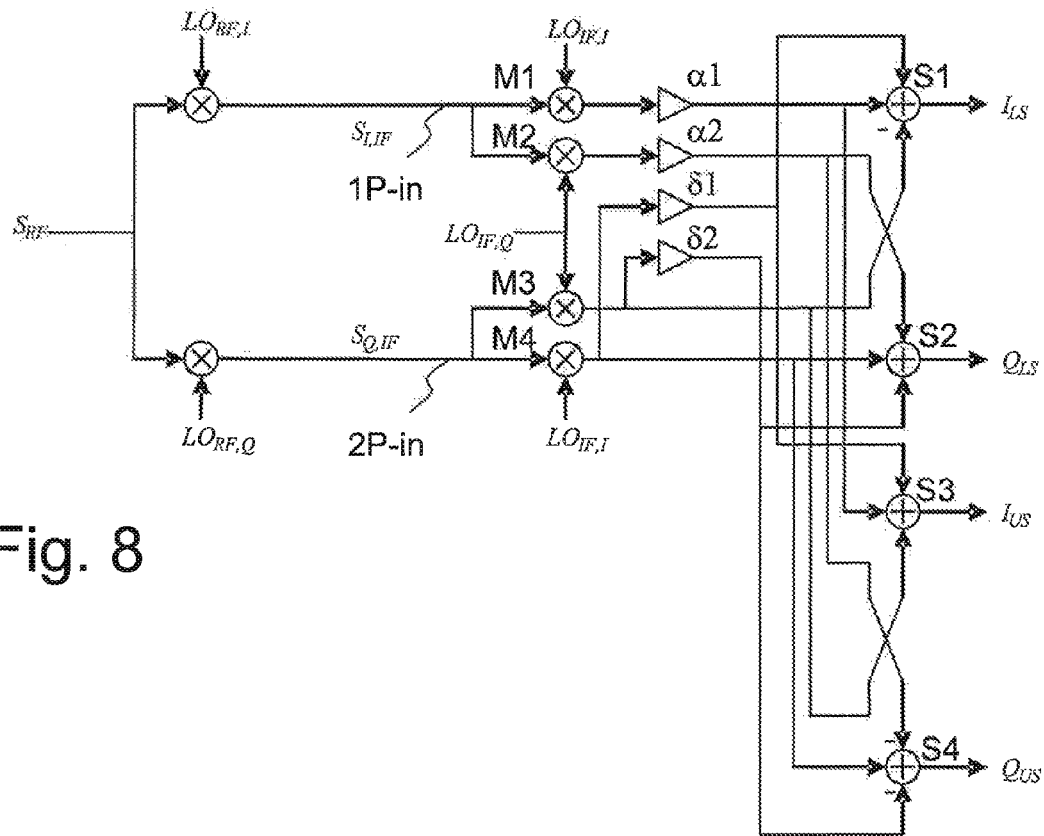
FIG. 8 shows a schematic block diagram of a complex IF mixer according to embodiments of the present invention.

With reference to FIG. 8, there is shown an exemplifying complex intermediate frequency mixer IFM according to the present invention. In order to keep the Figure less complex, it is referred to FIG. 13 for indication of some of the reference numerals used here. The complex IF mixer further comprises a third summing unit S3, having a third summing input S3-in and a third summing output S3-out. The third summing input S3-in is connected to the first gain output $\alpha 1$-out, the fourth gain output and the third mixer output M3-out. The complex IF mixer further comprises a fourth summing unit S4, having a fourth summing input S4-in and a fourth summing output S4-out. The fourth summing input S4-in is connected to the second gain output $\alpha 2$-out negated, the third gain output $\delta 2$-out negated and the fourth mixer output M4-out. The third and fourth summing units S3, S4 are configured to output a second baseband complex signal of the received complex IF signal. Thereby, the complex IF mixer may process and output a second baseband complex signal of the received complex IF signal in addition to the first baseband complex signal. Consequently, the complex IF mixer may support dual carriers or bands in the received complex IF signal. The two carriers or bands may be contiguous or non-contiguous.

As a consequence of statement A1 above, the value of $\delta$ may always be much smaller than unity as the initial IRR introduced by the RF down-converter is typically 30 dB or higher. This implies that the implementation of summing multiple mixer outputs as this "leak path" only will need to handle a very small signal (a few percent) as compared to the main signal paths (passing though gain adjusting components (denoted a) or directly from the third and fourth mixer, M3, M4). Thus, an advantage with this embodiment is that the power consumption associated with this signal path, i.e. the "leak path", will be negligible.

Above, the first and second gain adjusting components ($\alpha$, $\alpha 1$, $\alpha 2$) have been assumed to be adjusted to apply the same gain to a signal passing therethough and the third and fourth gain adjusting components ($\delta$, $\delta 1$, $\delta 2$) have been assumed to be adjusted to apply the same gain to a signal passing therethrough. It shall be understood that it is not required that two or more gain adjusting components, such as any of the first, second, third and fourth gain adjusting component, are adjusted to apply the same gain to the signal passing through said two or more gain adjusting components.

Thus, in a further embodiment of the complex intermediate frequency mixer IFM, the first and second gain adjusting components have been controlled to apply different gain to signals passing though the first and second gain adjusting components, respectively, and the third and fourth gain adjusting components have been controlled to apply different gain to signals passing though the third and fourth gain adjusting components, respectively.

Figure 7:
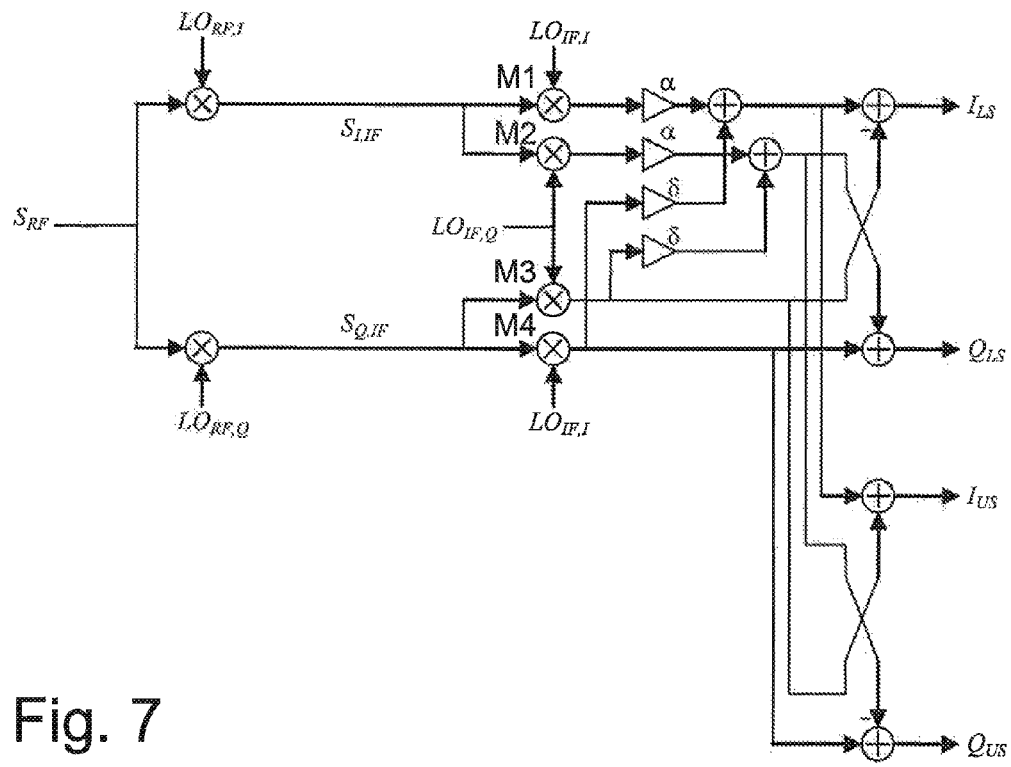
FIG. 7 shows a schematic block diagram of a complex IF mixer according to embodiments of the present invention.

The gain of the gain adjusting components $\alpha$ and $\delta$ are each applied on two signal paths (as shown in FIG. 7). The embodiments above assume that they are implemented to provide the same conversion gain for the signal two paths. In practice, there will always be a small imbalance introduced here as well. If the matching between these paths is not sufficient, the parameters in FIG. 7 may be controlled independently (individually) as in another embodiment shown in FIG. 9. The embodiment of FIG. 9 does not imply any significant increase in complexity. Normally, the values of the gain adjusting components do not differ largely. As an example, $\alpha_1$ may be slightly different from $\alpha_2$ and $\delta_1$ may be slightly different from $\delta_2$.

In the embodiments illustrated above, the first, second, third and fourth gain adjusting components have been placed after the IF mixer multiplying devices. In most cases, this will be a good option as they operate in portions of the signal paths where the frequency is low, i.e. baseband frequency. But it is readily understood that the gain adjusting components may be moved to facilitate a specific circuit implementation of the IF mixer architecture. It may though be advantageous to arrange the gain adjusting components such that gain of the signals are adjusted at base band frequency. For example, a gain adjusting component may be implemented in different ways, such as gain adjustable amplifiers, separate variable swing LO drivers driving individual mixers (M1-M4) to indirectly alter gain, tuneable passive networks, or weighted summing networks.

Figure 11:
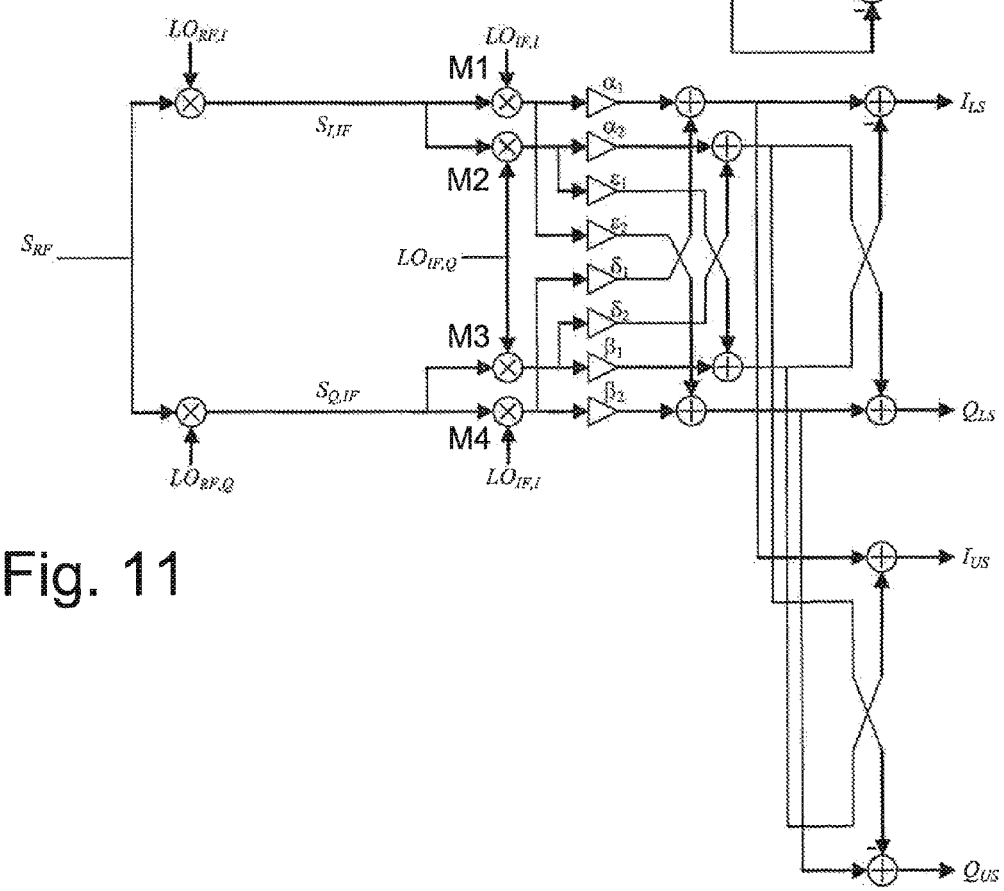
FIG. 11 shows a schematic block diagram of a complex IF mixer according to embodiments of the present invention.

In embodiments of the present invention, it may be preferred that the design of the circuit is symmetric. For example, the embodiment of FIG. 9 may be designed to be symmetric as shown in FIG. 11. Here $\beta_1$ and $\beta_2$ correspond to $\alpha_1$ and $\alpha_2$ and $\epsilon_1$ and $\epsilon_2$ correspond to $\delta_1$ and $\delta_2$. These additional gain adjusting components have been introduced such that each mixer will be loaded equally (one main path and one leak path) and the summations are symmetric too. However, sometimes these additional parameters $\beta_1$ and $\beta_2$, $\epsilon_1$ and $\epsilon_2$ do not necessarily have to be controlled, they could be set to their nominal values ($\beta_1=\beta_2=1$, $\epsilon_1=\epsilon_2=0$) while the actual control/tuning is performed on only a and $\alpha$ (or $\alpha_1, \alpha_2, \delta_1$, and $\delta_2$) just as for the architecture in FIG. 9.

Figure 9:
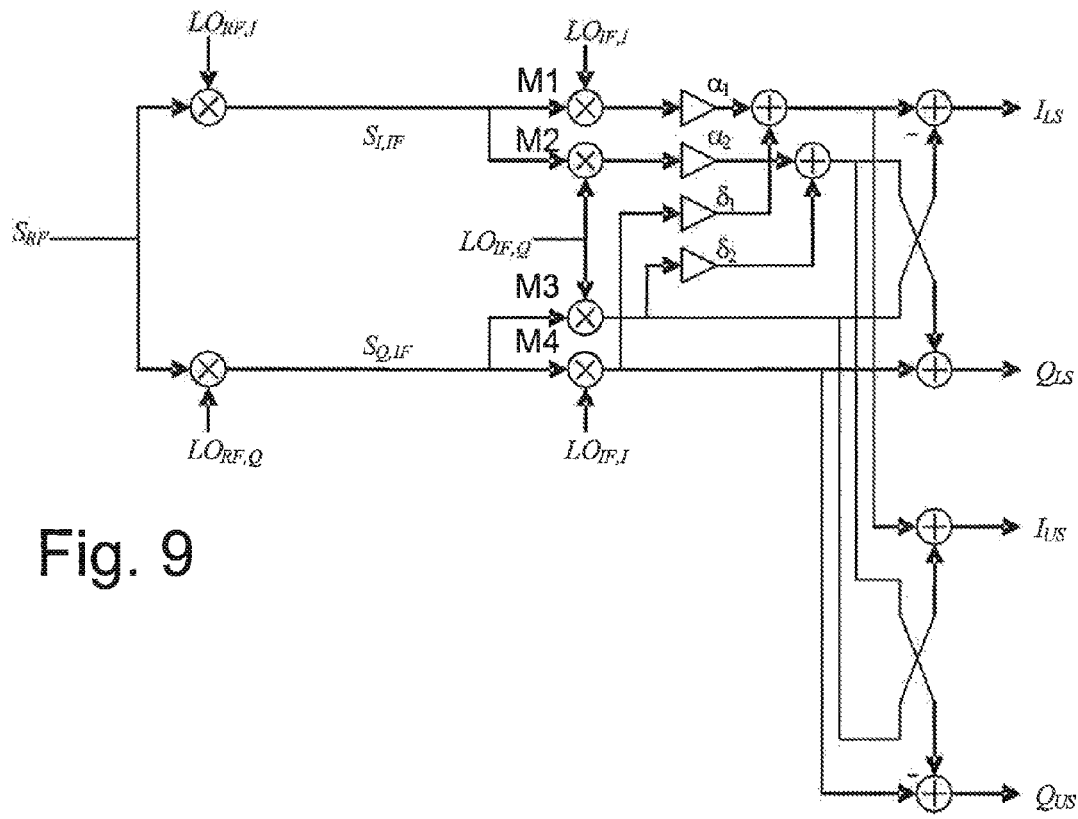
FIG. 9 shows a schematic block diagram of a complex IF mixer according to embodiments of the present invention.
Figure 10:
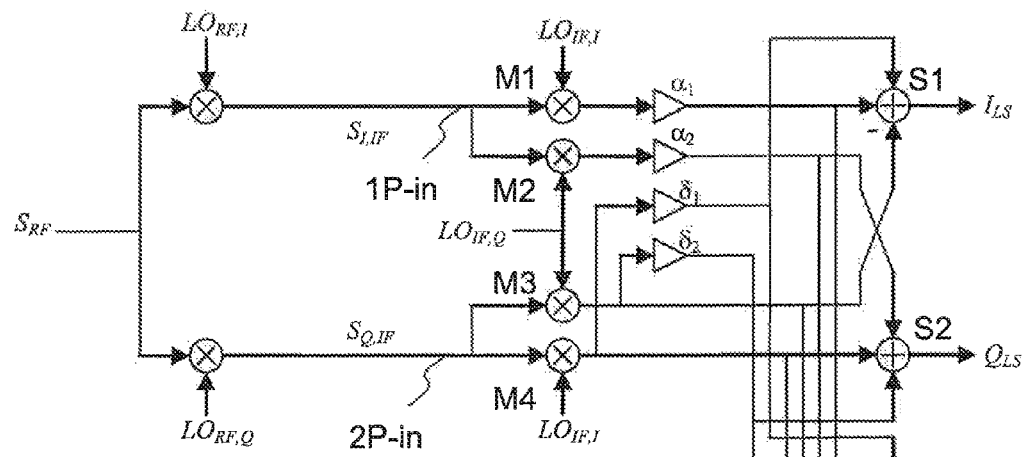
FIG. 10 shows a schematic block diagram of a complex IF mixer according to embodiments of the present invention.

The embodiments of FIGS. 9 and 11 are based on performing summations in two steps. As for the previously described examples of the complex IF mixer a corresponding example of the complex IF mixer (see FIGS. 10 and 12), where the summing units have been combined may be derived as well. As is clearly seen in FIGS. 10 and 12, these examples now comprise summing units, which are connected to three or four signals, respectively, or rather connected to outputs of the mixers and gain adjusting components. Notably, some of the gain adjusting components should be set to nominal values as discussed above [$\beta_1=\beta_2=1$, $\epsilon_1=\epsilon_2=0$].

Figure 12:
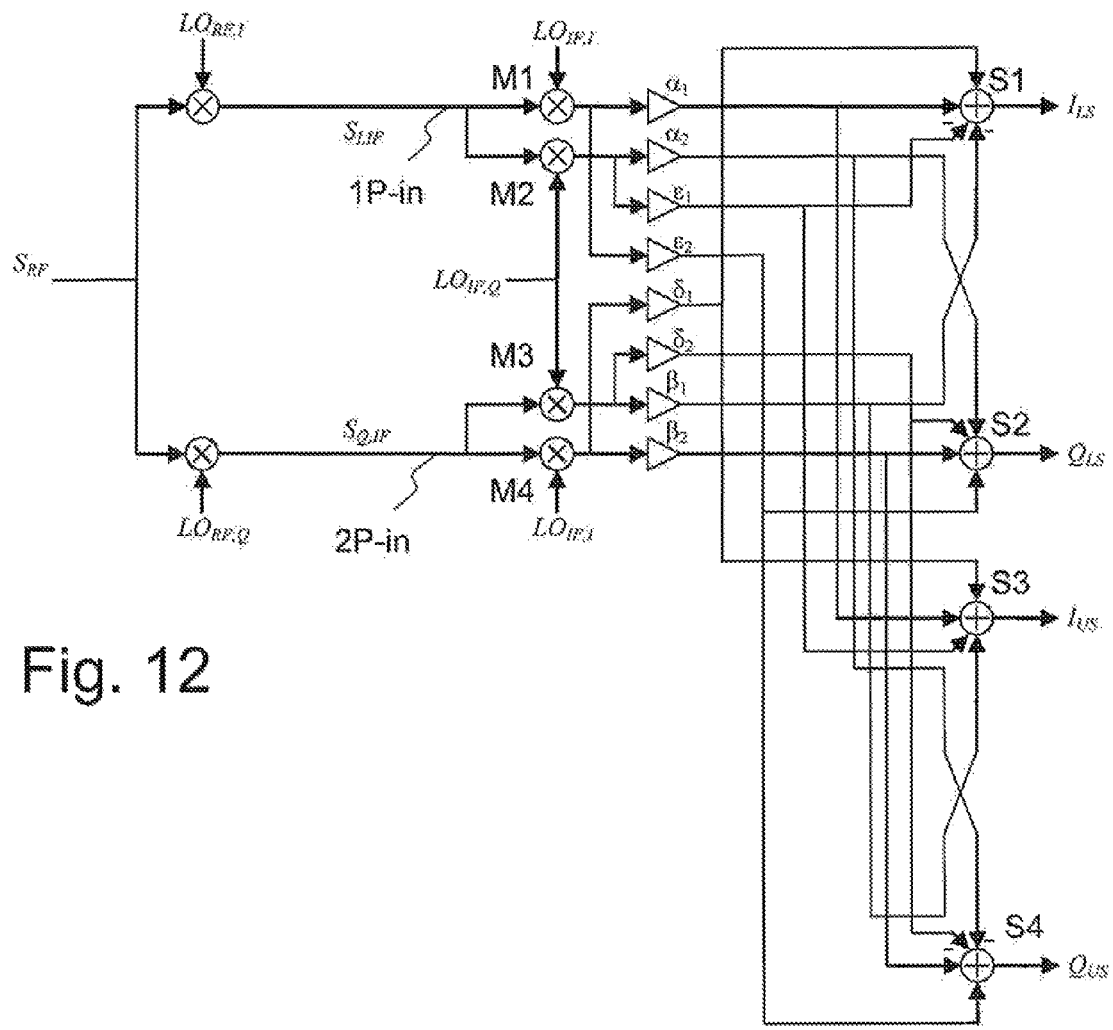
FIG. 12 shows a schematic block diagram of a complex IF mixer according to embodiments of the present invention.

With reference to FIG. 12, there is shown an exemplifying complex intermediate frequency mixer IFM according to embodiments of the present invention. In order to keep the Figure less complex, it is referred to FIG. 13 for indication of some of the reference numerals used here. The complex IF mixer IFM further comprises a fifth gain adjusting component $\epsilon 2$, having a fifth gain input $\epsilon 2$-in, a fifth gain output $\epsilon 2$-out and a fifth gain control input $\epsilon 2$-cin. The fifth gain input $\epsilon 2$-in is connected to the first mixer output M1-out. The complex IF mixer further comprises a sixth gain adjusting component $\epsilon 1$, having a sixth gain input $\epsilon 1$-in, a sixth gain output $\epsilon 1$-out and a sixth gain control input $\epsilon 1$-cin. The sixth gain input $\epsilon 1$-in is connected to the second mixer output M2-out. The complex IF mixer further comprises a seventh gain adjusting component $\beta 1$, having a seventh gain input $\beta 1$-in, a seventh gain output $\beta 1$-out and a seventh gain control input $\beta 1$-cin. The seventh gain input $\beta 1$-in is connected to the third mixer output M3-out. The complex IF mixer further comprises an eighth gain adjusting component $\beta 2$, having an eighth gain input $\beta 2$-in, an eighth gain output $\beta 2$-out and an eighth gain control input $\beta 2$-cin. The eighth gain input $\beta 2$-in is connected to the fourth mixer output M4-out. The complex IF mixer further comprises a third summing unit S3, having a third summing input S3-in and a third summing output S3-out, wherein the third summing input S3-in is connected to the first gain output $\alpha 1$-out, the sixth gain output $\epsilon 1$-out and the seventh gain output $\beta 1$-in, and a fourth summing unit S4, having a fourth summing input S4-in and a fourth summing output S4-out, wherein the fourth summing input S4-in is connected to the second gain output $\alpha 2$-out negated, the fifth gain output $\epsilon 2$-out and the eighth gain output $\beta 2$-out. Furthermore, the first summing input S1 is connected to the third mixer output M3-out via the seventh gain adjusting component $\beta 1$ negated, and the second summing input S2 is connected to the fourth mixer output M4-out via the eighth gain adjusting component $\beta 2$. The third and fourth summing units S3, S4 are configured to output a second baseband complex signal of the received complex IF signal. Still referring to FIG. 12, the first summing input S1-in is further connected to the sixth gain output $\delta 1$-out, the second summing input S2-in is further connected to the fifth gain output $\delta 2$-out, the third summing input S3-in is further connected to the fourth gain output $\delta 1$-out, and the fourth summing input S4-in is further connected to the third gain output $\delta 2$-out negated.

The complexity of the architecture in FIG. 12 calls for another way of defining a symmetric architecture with combined summation where the additional paths (through $\epsilon_1$ and $\epsilon_2$) could play a more active part. The idea is to use $\delta_1$ and $\delta_2$ for the lower-side carrier only (as in FIG. 6) and $\epsilon_1$ and $\epsilon_2$ for the upper-side carrier only whereas the paths defined by $\beta_1$ and $\beta_2$ are again set to unity. This gives the alternative symmetric architecture shown in FIG. 13. In this architecture each $\delta$ and $\epsilon$ path only connects to one summation.

Figure 13:
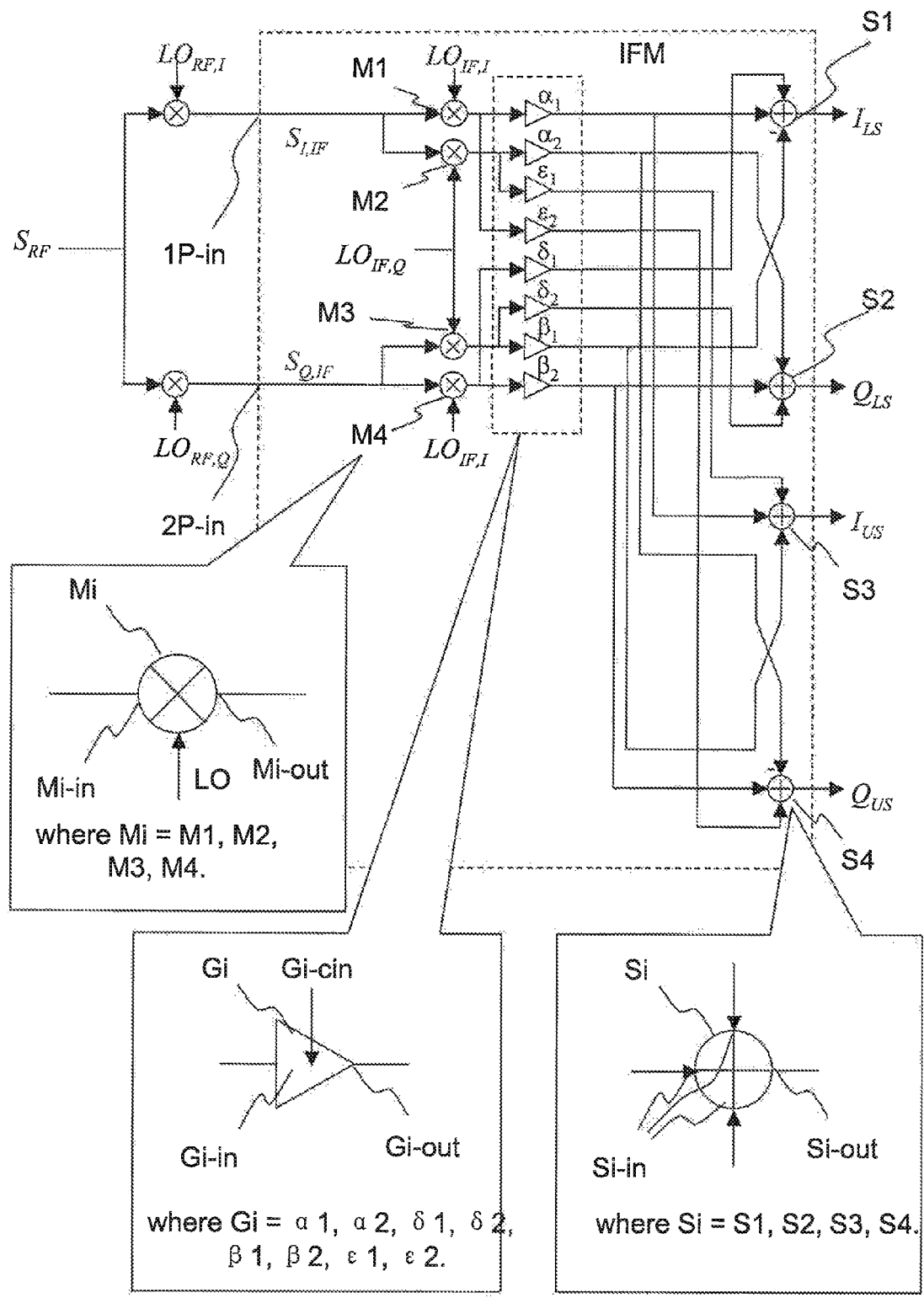
FIG. 13 shows a schematic block diagram of a complex IF mixer according to embodiments of the present invention.

With reference to FIG. 13, there is shown an exemplifying complex intermediate frequency mixer IFM comprising, in addition to what is already described in conjunction with FIG. 6, a fifth gain adjusting component $\epsilon 2$, having a fifth gain input $\epsilon 2$-in, a fifth gain output $\epsilon 2$-out and a fifth gain control input $\epsilon 2$-cin. The fifth gain input $\epsilon 2$-in is connected to the first mixer output M1-out. The complex IF mixer further comprises a sixth gain adjusting component $\epsilon 1$, having a sixth gain input $\epsilon 1$-in, a sixth gain output $\epsilon 1$-out and a sixth gain control input $\epsilon 1$-cin. The sixth gain input $\epsilon 1$-in is connected to the second mixer output M2-out. The complex IF mixer further comprises a seventh gain adjusting component $\beta 1$, having a seventh gain input $\beta 1$-in, a seventh gain output $\beta 1$-out and a seventh gain control input $\beta 1$-cin. The seventh gain input $\beta 1$-in is connected to the third mixer output M3-out. The complex IF mixer further comprises an eighth gain adjusting component $\beta 2$, having an eighth gain input $\beta 2$-in, an eighth gain output $\beta 2$-out and an eighth gain control input $\beta 2$-cin. The eighth gain input $\beta 2$-in is connected to the fourth mixer output M4-out. The complex IF mixer further comprises a third summing unit S3, having a third summing input S3-in and a third summing output S3-out, wherein the third summing input S3-in is connected to the first gain output $\alpha 1$-out, the sixth gain output $\epsilon 1$-out and the seventh gain output $\beta 1$-in, and a fourth summing unit S4, having a fourth summing input S4-in and a fourth summing output S4-out, wherein the fourth summing input S4-in is connected to the second gain output $\alpha 2$-out negated, the fifth gain output $\epsilon 2$-out and the eighth gain output $\beta 2$-out. Furthermore, the first summing input S1 is connected to the third mixer output M3-out via the seventh gain adjusting component $\beta 1$ negated, and the second summing input S2 is connected to the fourth mixer output M4-out via the eighth gain adjusting component $\beta 2$. The third and fourth summing units S3, S4 are configured to output a second baseband complex signal of the received complex IF signal. In order to keep the drawings less muddled three blow ups of a mixer, a gain adjusting component and a summing unit, respectively, are shown. In the first blow up, a mixer Mi is shown, where Mi may be the first, second, third or fourth mixer M1, M2, M3, M4. The mixer Mi has a mixer input Mi-in and a mixer output Mi-out. Further, the mixer Mi is driven by a local oscillating signal LO, where the local oscillating signal may be LO(IF,I) for the first mixer M1 and the fourth mixer M4 and may be LO(IF,Q) for the second mixer M2 and the third mixer M3. In the second blow up, a gain adjusting component Gi is shown, where Gi may be the first, second, third, fourth, fifth, sixth, seventh or eighth gain adjusting component $\alpha 1, \alpha 2, \beta 1, \beta 2, \epsilon 1, \epsilon 2, \delta 1, \delta 2$. Moreover, the gain adjusting component Gi has a gain input Gi-in and a gain output Gi-out. A gain control input is denoted Gi-cin. The gain control input is used to adjust the gain of a signal feed into the gain adjusting component Gi via the gain input Gi-in. In the third blow up, there is shown a summing unit Si, where the summing unit Si may be the first, second, third or fourth summing unit S1, S2, S3, S4. The summing unit Si has a number of summing inputs Si-in. In embodiments, there number of summing inputs range from two to four. Typically, the summing unit Si has three summing inputs Si-in as in the embodiment shown in FIG. 13.

The advantages of this architecture are easily seen. From the Figure, it may be seen that it is a symmetrical structure. This has, for example, the advantage that the first, second, third and fourth mixers are equally loaded. Thereby, it is possible to achieve a matched implementation. A matched implementation means that loads in the circuit are equally distributed among the components therein and aims to maximize the balance between the signal paths. Moreover, this embodiment uses a few number of summing unit inputs than the embodiment of FIG. 12. This may reduce hardware costs and simplify design. Furthermore, since the gain of the first, second, third, fourth, fifth, sixth, seventh and eighth gain adjusting components may be set separately a simple calibration procedure may be applied.

As an alternative, the first, second, third and fourth mixers and the corresponding gain adjusting components may be merged together, or the gain adjusting components and corresponding summing units may be merged together.

Figure 14:
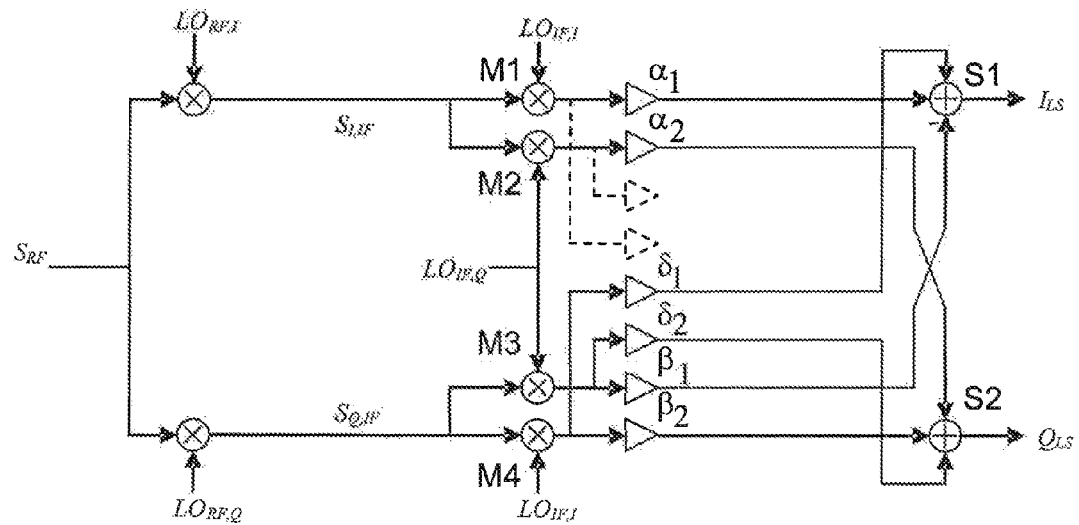
FIG. 14 shows a schematic block diagram of a complex IF mixer according to embodiments of the present invention.
Figure 15:
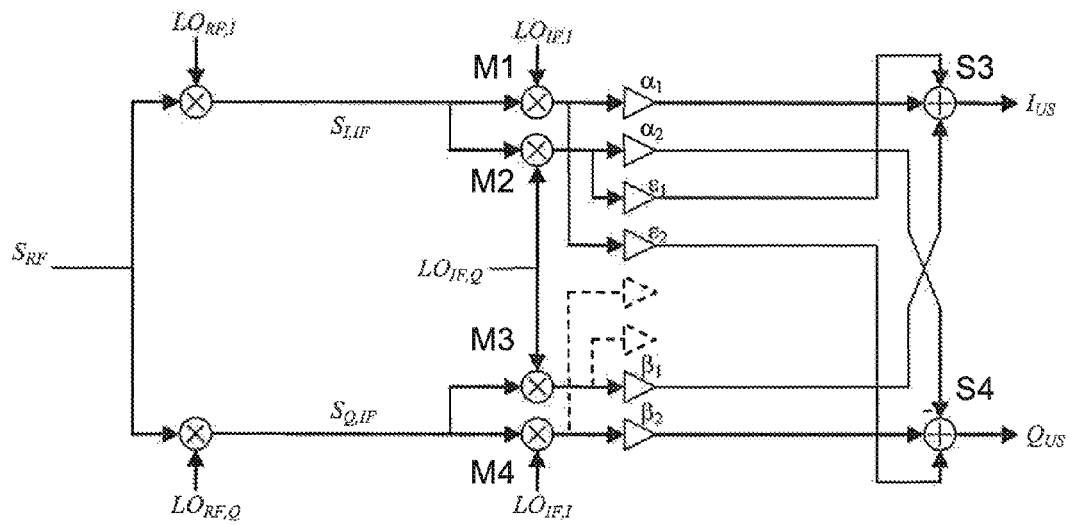
FIG. 15 shows a schematic block diagram of a complex IF mixer according to embodiments of the present invention.

If only the part resulting in the lower-side carrier of the embodiment of FIG. 13 is considered, the embodiment of FIG. 14 is obtained. Correspondingly the part resulting in the upper-side carrier is shown in FIG. 15. Thus, for the upper-side carrier the parameters ε1 and ε2 ($\epsilon_1, \epsilon_2$) must be assigned a value (they cannot be set to zero in this embodiment).

When implementing the complex IF mixer and the associated correction network is possible to consider each multiplying element to have a voltage output and the signal summing to be carried out by adding currents into a low impedance node, such as a virtual ground. A V-I conversion may be implemented by use of resistors or passive/active circuit blocks performing V-I conversion as gain adjusting components (tuneable resistors to incorporate control of gain).

Figure 16:
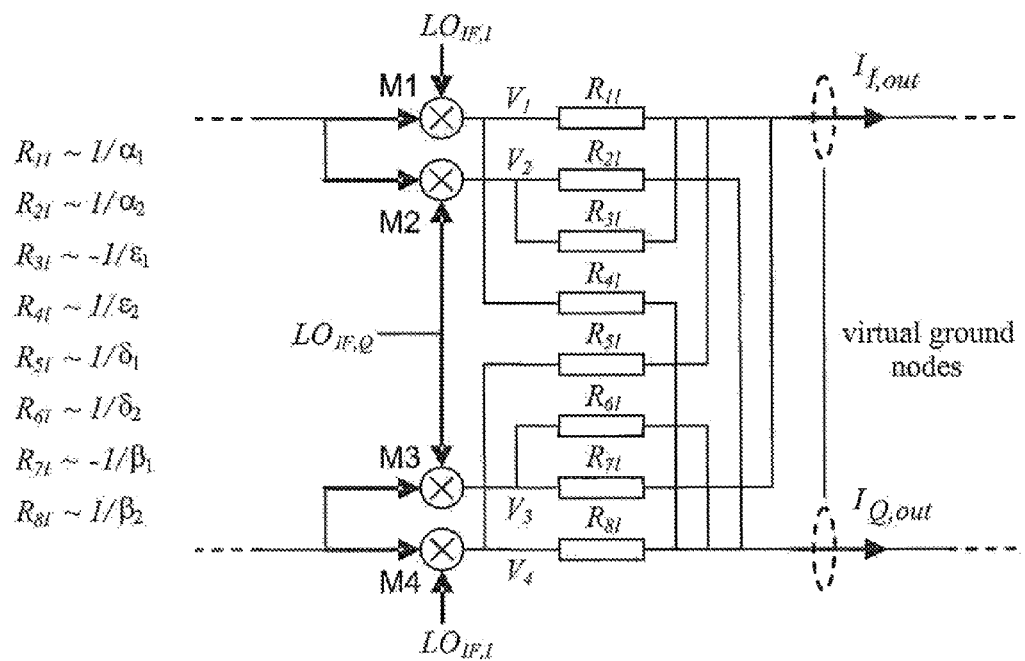
FIG. 16 shows a schematic block diagram over a circuit implementation of a complex IF mixer according to embodiments of the present invention.

FIG. 16 illustrates the resistor-based complex mixer summation network, comprising summing units, for the lower-side carrier of the architecture in FIG. 12. For brevity, this is shown as a single-ended solution only. A real implementation of this circuit would be based on differential signal representation. This substantially simplifies the design of those gain adjusting components that need to apply a negative gain or when subtraction needs to be performed by the summing units. Consequently, a signal may be sign-shifted (or negated) by swapping '+' and '−' of the differential signal.

Figure 17:
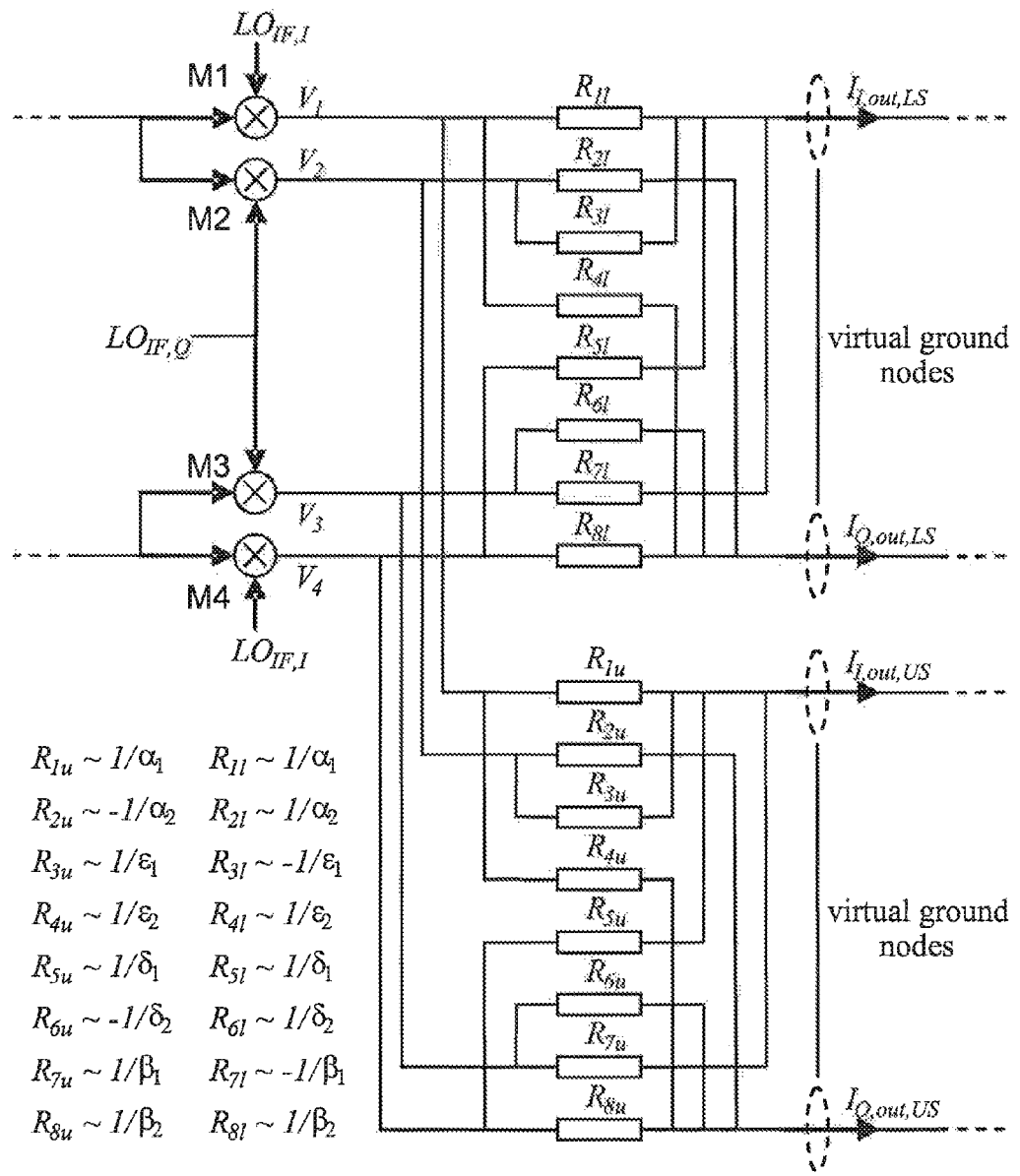
FIG. 17 shows a schematic block diagram over a circuit implementation of a complex IF mixer according to embodiments of the present invention.

The corresponding summation network, i.e. the summing units, for dual carrier reception architecture (again based on FIG. 12) is shown in FIG. 17. Here, one resistor network is used for the lower-side and upper-carrier respectively as output of each gain adjusting component is connected to two summing units.

Figure 18:
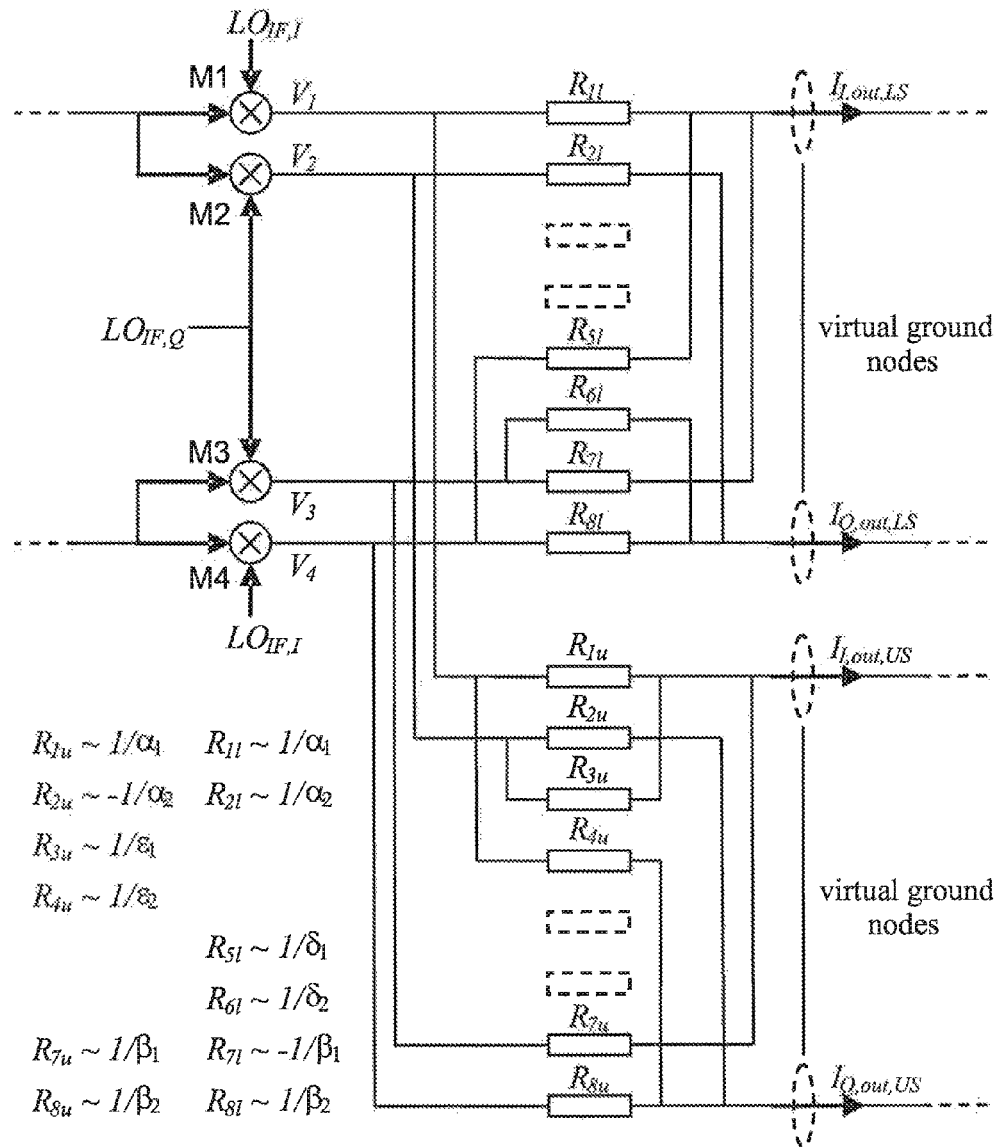
FIG. 18 shows a schematic block diagram over a circuit implementation of a complex IF mixer according to embodiments of the present invention.

A resistor-based summation network based on FIG. 13 is shown in FIG. 18. So again, outputs of gain adjusting components that are connected to two summing units must be duplicated. However, as each leak path ($\epsilon_1, \epsilon_2, \delta_1, \delta_2$) is connected to either the lower-side or upper-side carrier outputs these paths do not have to be duplicated. Thus, the architecture in FIG. 13 also results in lower complexity with respect to circuit implementation while still providing symmetric loading of the multiplying elements.

For these circuit implementations where gain adjusting components are duplicated to facilitate multiple summations of currents it should be understood that the corresponding resistors actually could be set to different values, e.g. R1u does not have to be set to the same value as R11 as exemplified in the Figures. The set of the resistors for the lower-side carrier can be set partly or completely independently from the set of resistors for the upper-side carrier.

The above resistor-based solutions maybe generalized such that each resistor is actually representing any V-I conversion (passive and/or active) from the mixer outputs to the current summing nodes. A more generalized circuitry may for example be configured to provide the same impedance level as seen from the mixer outputs as well as the summing nodes. One example of such a circuit is a resistive Pi-network. Use of an active V-I conversion provides increased isolation between mixer outputs.

A further generalization includes the use of V-I conversion network including reactive components to provide a frequency selective summing. This can be used to implement part of the channel-selective filtering.

If the embodiment of FIG. 11 or FIG. 13 is implemented, it is seen that it will also be possible to adjust for gain imbalances between the multiplying devices (the first, second, third and fourth mixers) in the IF mixer and even between the different signal paths as each mixer output contribution to any given node (summing unit) may be controlled. The latter means that the imbalance between gain adjusting components may be handled too. Correction of gain imbalance only for the complex mixer (omitting the phase imbalance) may be justified if the IF frequency is low enough such that the time alignment between the IF mixer LO signals is of no concern.

While the examples above primarily concern implementation in analog domain, it is understood that the embodiments described herein may be implemented in analog or digital domain or partitioned to include both domains. For example, the multiplying devices may be implemented in analog domain and signal summation in the digital domain. For this case, there will be no imbalance introduced in those parts that are implemented in the digital domain.

Even though the invention has been described with reference to specific exemplifying embodiments thereof, many different alterations, modifications and the like will become apparent for those skilled in the art. The described embodiments are therefore not intended to limit the scope of the invention, which is defined by the appended claims.

The invention claimed is:

1. A complex intermediate frequency (IF) mixer for frequency translating a received complex IF signal, wherein the received complex IF signal comprises at least two frequency bands located at upper-side and lower-side of 0 Hz, the complex IF mixer comprising:
   a first-phase path input for receiving a first-phase signal of the received complex IF signal;
   a second-phase path input for receiving a second-phase signal of the received complex IF signal;
   a first mixer configured to be driven by a first-phase local oscillator signal and connected to the first-phase path input, the first mixer having a first mixer output;
   a second mixer configured to be driven by a second-phase local oscillator signal and connected to the first-phase path input, the second mixer having a second mixer output, wherein the first-phase local oscillator signal and the second-phase local oscillator signal are in quadrature phase;
   a third mixer configured to be driven by the second-phase local oscillator signal and connected to the second-phase path input, the third mixer having a third mixer output;
   a fourth mixer configured to be driven by the first-phase local oscillator signal and connected to the second-phase path input, the fourth mixer having a fourth mixer output;

wherein the first mixer is configured to down-convert the first-phase signal of the received complex IF signal from a received frequency of the first-phase signal to a baseband frequency, using the first-phase local oscillator signal, to form a first signal to be output from the first mixer output;

wherein the second mixer is configured to down-convert the first-phase signal of the received complex IF signal from the received frequency of the first-phase signal to a baseband frequency, using the second-phase local oscillator signal, to form a second signal to be output from the second mixer output;

wherein the third mixer is configured to down-convert the second-phase signal of the received complex IF signal from a received frequency of the second-phase signal to a baseband frequency, using the second-phase local oscillator signal, to form a third signal to be output from the third mixer output;

wherein the fourth mixer is configured to down-convert the second-phase signal of the received complex IF signal from the received frequency of the second phase signal to a baseband frequency, using the first-phase local oscillator signal, to form a fourth signal to be output from the fourth mixer output;

a first gain adjusting component having a first gain input, a first gain output, and a first gain control input for adjusting gain of the first gain adjusting component; wherein the first gain input is connected to the first mixer output;

a second gain adjusting component having a second gain input, a second gain output, and a second gain control input for adjusting gain of the second gain adjusting component; wherein the second gain input is connected to the second mixer output;

a third gain adjusting component having a third gain input, a third gain output, and a third gain control input for adjusting gain of the third gain adjusting component; wherein the third gain input is connected to the third mixer output;

a fourth gain adjusting component having a fourth gain input, a fourth gain output, and a fourth gain control input for adjusting gain of the fourth gain adjusting component; wherein the fourth gain input is connected to the fourth mixer output;

a first summing unit having a first summing input and a first summing output, the first summing input connected to:
the first gain output;
the fourth gain output; and
the output from the third mixer which is negated at the first summing input; and a second summing unit having a second summing input and a second summing output, the second summing input connected to:
the second gain output;
the third gain output; and
the fourth mixer output;

wherein the first and second summing units are configured to output a first baseband complex signal of the received complex IF signal.

2. The complex IF mixer of claim 1 further comprising:
a third summing unit having a third summing input and a third summing output, the third summing input connected to:
the first gain output;
the fourth gain output; and
the third mixer output; and a fourth summing unit having a fourth summing input and a fourth summing output, the fourth summing input connected to:
a negated second gain output;
a negated third gain output; and
the fourth mixer output;

wherein the third and fourth summing units are configured to output a second baseband complex signal of the received complex IF signal.

3. The complex IF mixer of claim 1, wherein the first-phase signal is an in-phase signal and the second-phase signal is a quadrature phase signal.

4. The complex IF mixer of claim 1:
wherein the first and second gain adjusting components are configured to apply different gain to signals passing through the first and second gain adjusting components, respectively; and
wherein the third and fourth gain adjusting components are configured to apply different gain to signals passing through the third and fourth gain adjusting components, respectively.

5. A radio receiver comprising:
a quadrature Radio Frequency (RF) mixer for generating a complex intermediate frequency (IF) signal by down-conversion of an RF signal; wherein the complex IF signal comprises at least two frequency bands located at upper-side and lower-side of 0 Hz; and
a complex IF mixer for frequency translating the complex IF signal, the complex IF mixer comprising:
a first-phase path input for receiving a first-phase signal of the complex IF signal;
a second-phase path input for receiving a second-phase signal of the complex IF signal;
a first mixer configured to be driven by a first-phase local oscillator signal and connected to the first-phase path input, the first mixer having a first mixer output;
a second mixer configured to be driven by a second-phase local oscillator signal and connected to the first-phase path input, the second mixer having a second mixer output, wherein the first-phase local oscillator signal and the second-phase local oscillator signal are in quadrature phase;
a third mixer configured to be driven by the second-phase local oscillator signal and connected to the second-phase path input, the third mixer having a third mixer output;
a fourth mixer configured to be driven by the first-phase local oscillator signal and connected to the second-phase path input, the fourth mixer having a fourth mixer output;
wherein the first mixer is configured to down-convert the first-phase signal of the complex IF signal from a received frequency of the first-phase signal to a baseband frequency, using the first-phase local oscillator signal, to form a first signal to be output from the first mixer output;
wherein the second mixer is configured to down-convert the first-phase signal of the complex IF signal from the received frequency of the first-phase signal to a baseband frequency, using the second-phase local oscillator signal, to form a second signal to be output from the second mixer output;
wherein the third mixer is configured to down-convert the second-phase signal of the complex IF signal from a received frequency of the second-phase signal to a baseband frequency, using the second-phase local oscillator signal, to form a third signal to be output from the third mixer output; and wherein the fourth mixer is configured to down-convert the second-phase signal of the complex IF signal from the received frequency of the second-phase signal to a baseband frequency, using the first-phase local oscillator signal, to form a fourth signal to be output from the fourth mixer output;

a first gain adjusting component having a first gain input, a first gain output, and a first gain control input for adjusting gain of the first gain adjusting component; wherein the first gain input is connected to the first mixer output;

a second gain adjusting component having a second gain input, a second gain output, and a second gain control input for adjusting gain of the second gain adjusting component; wherein the second gain input is connected to the second mixer output;

a third gain adjusting component having a third gain input, a third gain output, and a third gain control input for adjusting gain of the third gain adjusting component; wherein the third gain input is connected to the third mixer output;

a fourth gain adjusting component having a fourth gain input, a fourth gain output, and a fourth gain control input for adjusting gain of the fourth gain adjusting component; wherein the fourth gain input is connected to the fourth mixer output;

a first summing unit having a first summing input and a first summing output, the first summing input connected to:
the first gain output;
the fourth gain output; and
the output from the third mixer which is negated at the first summing input; and a second summing unit having a second summing input and a second summing output, the second summing input connected to:
the second gain output;
the third gain output; and
the fourth mixer output;

wherein the first and second summing units are configured to output a baseband complex signal of the complex IF signal.

6. The radio receiver of claim 5, wherein the RF signal comprises a number of frequency bands, each carrying an associated information signal.

* * * * *

UNITED STATES PATENT AND TRADEMARK OFFICE
CERTIFICATE OF CORRECTION

PATENT NO. : 9,020,077 B2
APPLICATION NO. : 13/823774
DATED : April 28, 2015
INVENTOR(S) : Sundström et al.

It is certified that error appears in the above-identified patent and that said Letters Patent is hereby corrected as shown below:

Specification

In Columns 2 & 3, Lines 14-67 & 1-4, delete "output,...............IF signal." and insert the same in Column 2, at Line 13, after "output,", as a continuation paragraph.

In Column 5, Line 39, delete "$\beta^1$," and insert -- $\beta_1$, --, therefor.

In Column 8, Line 24, delete "therethough" and insert -- therethrough --, therefor.

In Column 9, Line 12, delete "only a and α" and insert -- only α and δ --, therefor.

Signed and Sealed this
Thirteenth Day of October, 2015

Michelle K. Lee
*Director of the United States Patent and Trademark Office*